US009063254B2

(12) United States Patent  
Block

(10) Patent No.: US 9,063,254 B2  
(45) Date of Patent: Jun. 23, 2015

(54) WAVEGUIDE COUPLED SURFACE PLASMON POLARITION PHOTO DETECTOR

(71) Applicant: Intel Corporation, Santa Clara, CA (US)

(72) Inventor: Bruce A. Block, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/856,063

(22) Filed: Apr. 3, 2013

(65) Prior Publication Data

US 2013/0287333 A1    Oct. 31, 2013

Related U.S. Application Data

(63) Continuation of application No. 12/571,128, filed on Sep. 30, 2009, now Pat. No. 8,417,070.

(51) Int. Cl.
| | |
|---|---|
| *G02B 6/00* | (2006.01) |
| *B82Y 20/00* | (2011.01) |
| *G02B 6/12* | (2006.01) |
| *G02B 6/122* | (2006.01) |
| *H01L 31/105* | (2006.01) |
| *H01L 31/108* | (2006.01) |
| *H01L 31/0232* | (2014.01) |

(52) U.S. Cl.
CPC . *G02B 6/00* (2013.01); *B82Y 20/00* (2013.01); *G02B 6/12004* (2013.01); *G02B 6/1226* (2013.01); *H01L 31/105* (2013.01); *H01L 31/1085* (2013.01); *H01L 31/0232* (2013.01)

(58) Field of Classification Search
CPC ...... G02B 6/00; H01L 31/0232; H01L 29/74; H01L 31/108; H01L 21/00; H01L 31/0352; H01L 31/09
USPC ..................................................... 385/14, 12
See application file for complete search history.

(56) References Cited

U.S. PATENT DOCUMENTS 3,804,489 A * 4/1974 Li et al. .......................... 359/320  
7,203,387 B2 * 4/2007 Doan .............................. 385/14

(Continued)

FOREIGN PATENT DOCUMENTS

| JP | 10-509806 A | 9/1998 |
|---|---|---|
| JP | 2001-272559 A | 10/2001 |

(Continued)

OTHER PUBLICATIONS

Final Office Action for CN 201010506878.4, mailed Jul. 26, 2013, 16 pages.  
Assefa, S. et al., "CMOS-Integrated High-Speed MSM Germanium Waveguide Photodetector," Optics Express 18(5):4986-4999, Mar. 1, 2010.  
Davids, P. et al., "Surface Plasmon Polarization Filtering in a Single Mode Dielectric Waveguide," Optics Express 13(18): 7063-7069, Sep. 5, 2005.  
Non-Final Office Action for U.S. Appl. No. 12/571,128, mailed Jan. 9, 2012.

(Continued)

*Primary Examiner* — Kaveh Kianni  
(74) *Attorney, Agent, or Firm* — Schwabe Williamson & Wyatt PC

(57) ABSTRACT

A metal-semiconductor-metal (MSM) device couples light from an optical mode in a waveguide to a surface plasmon polarition (SPP) mode on an electrode surface of the MSM device. Once in an SPP mode, the absorption of light in the semiconductor can take place in a very small area. This may allow for a shrinking of the active detector area and allow for low capacitance, very short transit distance for the electrical carriers and allow for very low voltage devices and/or very high frequency.

19 Claims, 3 Drawing Sheets

(56) References Cited

U.S. PATENT DOCUMENTS

| | | | |
|---|---|---|---|
| 7,423,254 B2 | 9/2008 | Arend et al. | |
| 7,800,193 B2* | 9/2010 | Fujikata et al. | 257/449 |
| 8,183,656 B2* | 5/2012 | Okamoto et al. | 257/432 |
| 8,466,528 B2* | 6/2013 | Okamoto et al. | 257/432 |
| 8,467,637 B2* | 6/2013 | Fujikata et al. | 385/14 |
| 2009/0134486 A1* | 5/2009 | Fujikata | 257/449 |
| 2009/0324164 A1* | 12/2009 | Reshotko et al. | 385/14 |
| 2010/0013040 A1* | 1/2010 | Okamoto et al. | 257/432 |
| 2010/0119192 A1* | 5/2010 | Fujikata et al. | 385/14 |
| 2011/0110628 A1* | 5/2011 | Okamoto et al. | 385/37 |

FOREIGN PATENT DOCUMENTS

| | | |
|---|---|---|
| JP | 2008051232 A | 3/2008 |
| JP | 2008175615 A | 7/2008 |
| JP | 2008176209 A | 7/2008 |
| WO | 2007105593 A | 9/2007 |
| WO | 2008/136479 A1 | 11/2008 |

OTHER PUBLICATIONS

Final Office Action for U.S. Appl. No. 12/571,128, mailed Jun. 18, 2012.

Notice of Allowability for U.S. Appl. No. 12/571,128, mailed Dec. 10, 2012.

First Office Action for CN Application No. 201010506878.4, mailed Sep. 11, 2012.

Second Office Action for CN Application No. 201010506878.4, mailed Apr. 11, 2013.

First Office Action for JP Application No. 2010-206463, mailed Jan. 14, 2012.

Second Office Action for JP Application No. 2010-206463, mailed Feb. 19, 2013.

CN Office Action for CN Application No. 201010506878.4 dated Jul. 26, 2013.

DE Office Action for DE Application No. 102010045195.9 dated Nov. 20, 2013.

* cited by examiner

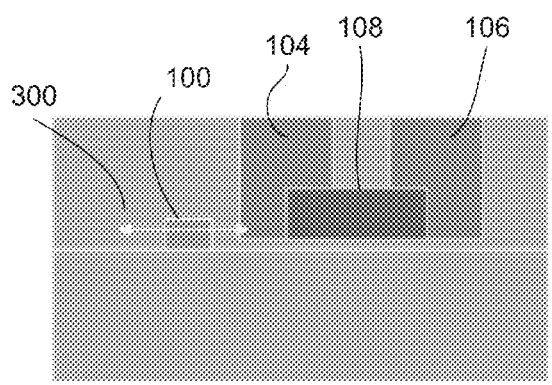
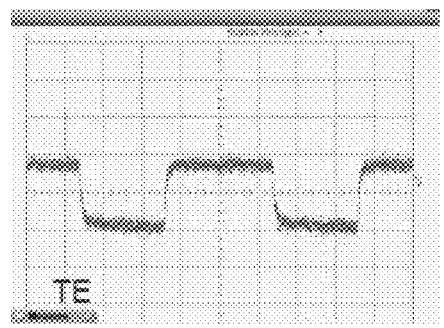
Fig. 3A    Fig. 3B
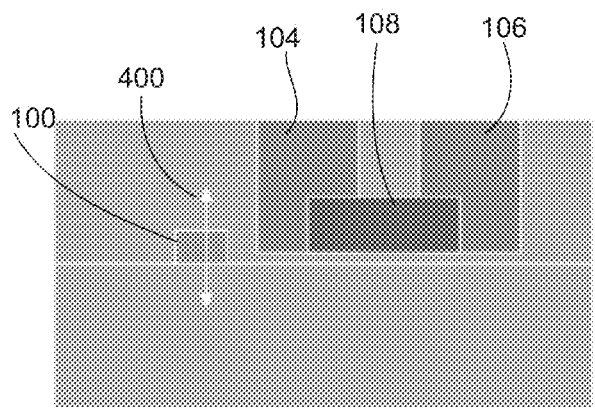
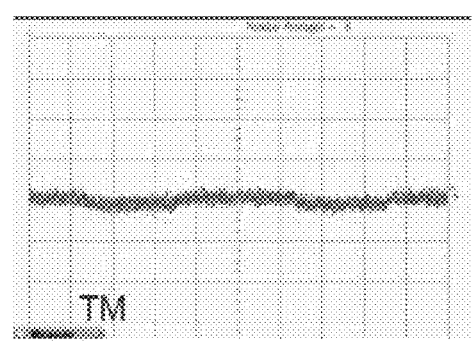
Fig. 4A    Fig. 4B

WAVEGUIDE COUPLED SURFACE PLASMON POLARITION PHOTO DETECTOR

FIELD OF THE INVENTION

Embodiments of the present invention are directed to photo detectors and, more particularly, to detecting light in a waveguide by converting it from waveguide mode to surface plasmon polarition mode (SPP).

BACKGROUND INFORMATION

Many applications rely on the ability to detect light signals traveling in a waveguide. Light propagates in straight line paths known as rays. Rays may be refracted, reflected, and scattered at material interfaces. In a dielectric waveguide, a high index core region may be surrounded by a lower index cladding layer. Rays may be confined in the high index core region by internal reflection at the core/cladding interface. The reflected rays may interfere with each other to form electromagnetic field patterns within the waveguide.

In a waveguide, light may have only certain allowed states called "modes." "Modes" of a waveguide refer to field patterns that propagate in the core region without dispersion, i.e., changing shape. The waveguide could be "single mode" if it only supports one mode, "Multimode" waveguides support many modes. An analogy of a mode may be thought of as a probability function, where the mode is similar to electron shells in atoms. An electron is confined in a shell, just as a photon is found in its mode. By changing the shape of the waveguide, the waveguide mode can no longer be supported, and light may be expelled, directed, steered or "forced" out of the waveguide and into the higher index detector.

A waveguide may guide light to a photodetector. To electrically detect light in a waveguide, the photodetector may absorb radiation, collect photogenerated charge and produce an electric current. Currently, evanescently coupled waveguide photodetectors or partially evanescently coupled/butt coupled photodetectors are used to detect light in a waveguide. Typically, with evanescent coupled photodetectors, the coupling is relatively weak and devices 20-100 microns long are needed to capture the light efficiently. This leads to higher dark current and detector capacitance which could limit the speed of the device.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

FIGS. 3A and 3B are the waveguide couple plasmon detector detecting a light signal polarized in TE mode and the detectors response, respectively;

FIGS. 4A and 4B are the waveguide couple plasmon detector detecting a light signal polarized in TM mode and the detectors response, respectively;

DETAILED DESCRIPTION

Embodiments describe an apparatus and method for sensing or detecting light intensity in an optical waveguide and converting the optical intensity (photons) into a current (electrons/holes).

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments are directed to a waveguide coupled photodetector. The waveguide may be any common waveguide material as long as it has a higher index of refraction from the surrounding cladding and waveguide and the cladding are both optically transparent.

In one embodiment, the detector is based upon a metal semiconductor metal (MSM) photo detector. In other embodiments the detector may be a PIN diode. In the case of the metal semiconductor metal photo detector, metal electrodes serves as both a contact to apply a voltage sweep out photogenerated carriers as well as a surface whereby a surface plasmon polarition (SPP) mode is excited and brings the light into semiconductor region of the detector to allow for efficient creation of electron-hole pairs and a photogenerated current.

Surface plasma polaritions, are fluctuations in the electron density at the boundary of two materials. Plasmons are the collective vibrations of an electron gas (or plasma) surrounding the atomic lattice sites of a metal. When plasmons couple with a photon, the resulting particle may be called a polarition. This polarition propagates along the surface of the metal until it decays, either by absorption, whereupon the energy is converted into phonons, or by a radiative transition into a photon, or creates an electron-hole pair if the energy is above band gap of a semiconductor.

Figure 1:
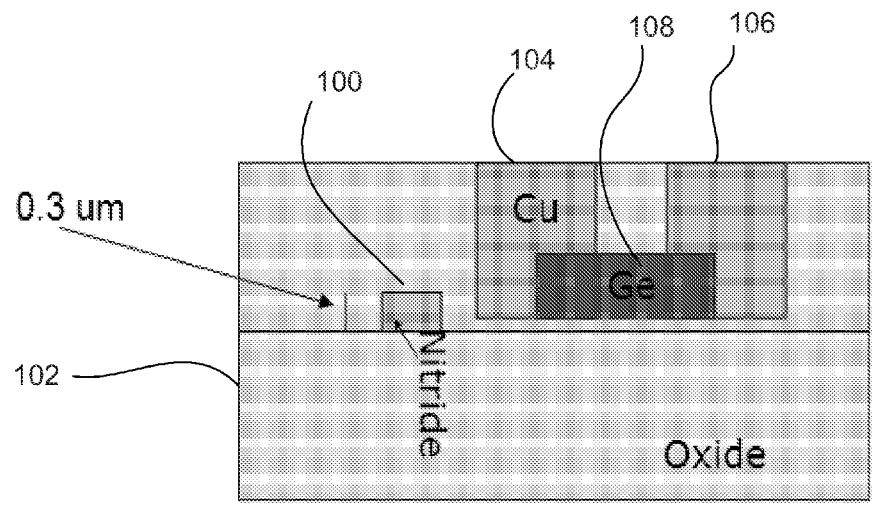
FIG. 1 is a cross sectional view of a waveguide coupled plasmon detector according to one embodiment.
Figure 2:
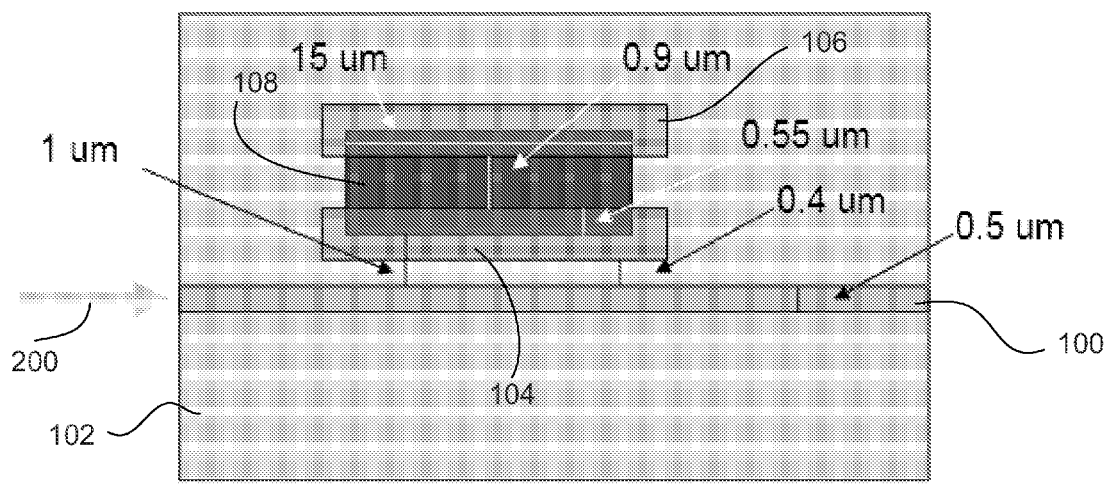
FIG. 2 is a top view of the waveguide couple plasmon detector shown in FIG. 1.

Referring now to Figure and FIG. 2, there is shown a cross sectional view and a top view, respectively, of one embodiment of a waveguide coupled plasmon detector according to one embodiment of the invention. A waveguide 100, such as a silicon nitride waveguide, comprises a silicon oxide cladding material 102. A detector comprises germanium (Ge) based metal-semiconductor-metal (MSM) type detector and may comprise first and second metal electrodes 104 and 106, separated by a distance. A layer of germanium (Ge) 108 may be sandwiched between the first electrode 104 and the second electrode 106, near the bottom portion of the electrodes 104 and 106. As shown, the electrodes 104 and 106 may comprises a metal, such as copper (Cu).

As shown in FIG. 2, example dimensions are offered. For example, the silicon nitride waveguide 100 may have a generally rectangular cross section and may be 0.5 um wide. The waveguide 100 may run parallel with the first electrode 104 and in very close proximity separated from the first electrode by a distance if 0.4 um and separated from the Ge semiconductor material by a distance of 1 um. The first electrode 104 and the second electrode 106 may be separated from each other by a distance of 0.5 um. The Ge semiconductor material 108 may be 15 um wide and may overlap into the first electrode 104 and the second electrode 106 by 0.55 um. All of these dimensions are approximate and are not necessarily optimized. All of these dimensions are offered as one possible scenario and may be tweaked or tuned for a particular situation for optimal performance.

In operation, light 200 propagating through the waveguide 100 in what may be termed "waveguide mode" may be converted to "surface plasma polarition mode" as it passes by the detector. Light confined in the waveguide 100 may interact strongly with the metal electrodes 104 placed in close proximity to the waveguide core 100 likely due to the mode tail in the dielectric cladding. This strong coupling between the mode and the metal surface can resonantly excite surface plasmons on the metal surface if the mode polarization has a component normal to the metal interface.

Thus, embodiments use a very efficient process of coupling the light from an optical mode in the waveguide 100 to a SPP mode on the electrode surface 104. Once in an SPP mode, the absorption of light in the semiconductor 108 can take place in a very small area. This may allow for a shrinking of the active detector area and allow for low capacitance, very short transit distance for the electrical carriers and allow for very low voltage devices and/or very high frequency.

A feature of the invention is that the light is first coupled out of the waveguide mode into a SPP mode. Since the SPP mode is highly confined ($<<\lambda$, the light wavelength) on the surface of the metal/semiconductor it allows for very small detector areas. Also, electrodes 104 and 106 may be spaced very close together (smaller than the diffraction limit) without losing efficiency of the collection of photons (compare to conventional detectors) that the voltage can be very low, but still a high field.

This may be beneficial for lower dark current of the device and speed since the carriers do not have to travel a long distance to be collected at the electrode. Another feature is that the launching of a SPP mode is dependant upon the incident polarization of the light. This make the possibility of having a polarization sensing detector which could be useful for optical logic (based on polarization) or polarization sensors. If you do not want this polarization sensitivity, it would be easy to design a detector which could detect both polarizations, such as by changing the orientation of the detector with relation to the waveguide, for example. The plasmon coupled waveguide photodetector could have benefit of being used as a very small photo detector tap, which funnels of a small bit of light and detects it. This may be used for monitoring devices in optical systems and data for feedback control.

FIG. 3A and FIG. 4A demonstrate the inventive device and its ability to detect polarized light. FIGS. 3A and 4A show a waveguide 100, such as a silicon nitride waveguide and a silicon oxide cladding material 102. Each also has a metal-semiconductor-metal (MSM) type detector comprising first and second metal electrodes 104 and 106, separated by a distance and a germanium (Ge) layer 108 sandwiched there between.

FIGS. 3B and 4B show the device responses with and optical clock signal of 1 MHz and a 1 V bias for both polarizations. That is, in FIGS. 3A and 3B the optical clock signal 300 is polarized TE mode (traverse electric, with no electric field in the direction of propagation), and in FIGS. 4A and 4B the optical clock signal 400 is polarized TM mode (traverse magnetic, with no magnetic field in the direction of propagation). As demonstrated by the responses shown in FIGS. 3B and 4B, the TE response compared to TM is nearly 10:1. That is, detector of the present invention was highly responsive to the TE polarization and far less responsive to the signal having being TM polarized.

Figure 5A:
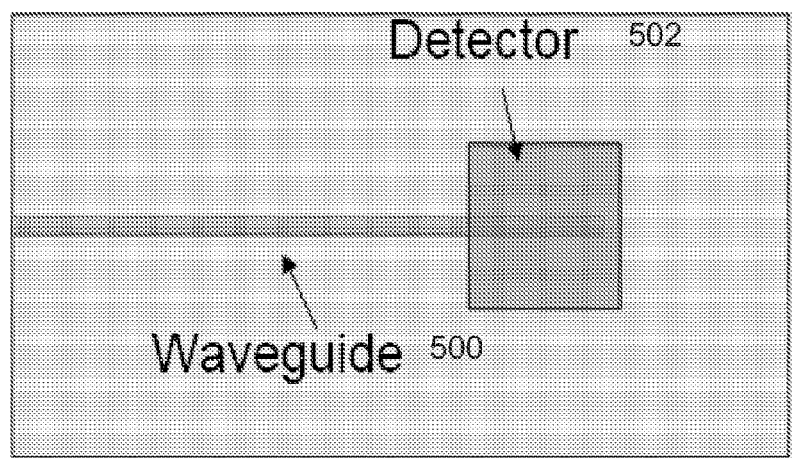
FIGS. 5A and 5B are a top and cross sectional view of another embodiment of a waveguide coupled plasmon photodetector, respectively.
Figure 5B:
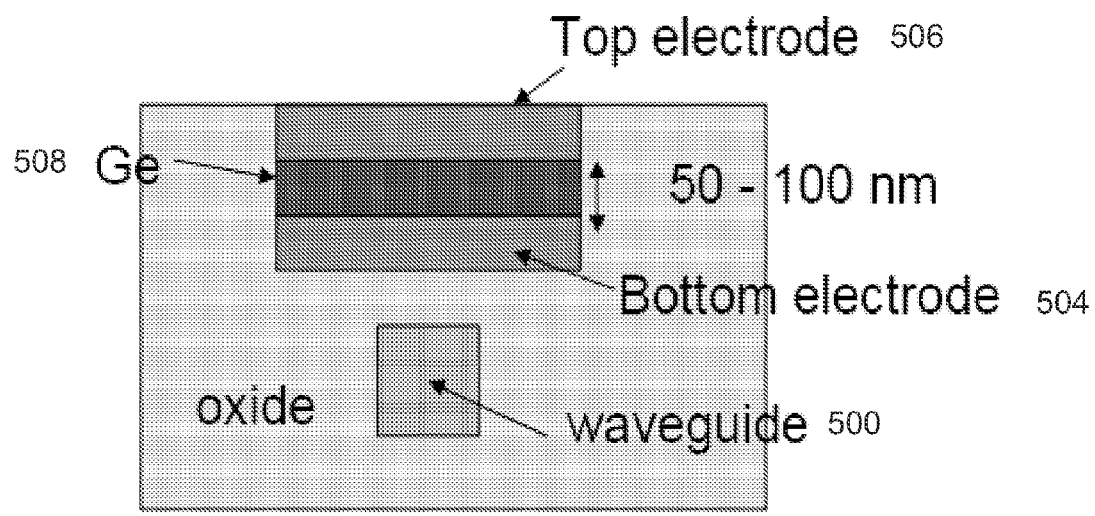

FIGS. 5A and 5B show one embodiment of a waveguide coupled plasmon photodetector. FIG. 5A shows a top view comprising a waveguide 500 with a detector 502 situated over the waveguide 500. FIG. 5B is a cross-sectional view of the waveguide plasmon photodetector shown in FIG. 5A. As shown, the device comprises the waveguide 500 with an oxide cladding 504. The a metal-semiconductor-metal (MSM) type detector, as previously described may comprise bottom and top metal electrodes 504 and 506, respectively, separated by a distance and a germanium (Ge) layer 508 sandwiched there between. Such a device may be useful in reaching higher data rates than would be possible with conventional waveguide coupled photodetectors and may allow for very efficient power sensors or polarization sensors that could help further the integration of optical devices.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
a metal-semiconductor-metal (MSM) photodetector configured to transform a light signal from waveguide mode to surface plasmon polarition (SPP) mode, the MSM photodetector comprising first and second electrodes and a semiconductor material substantially disposed in a cladding layer, wherein the first and second electrodes are disposed to extend from a surface of the cladding layer inside the cladding layer, wherein the first and second electrodes include respective top and bottom portions, wherein respective ends of the top portions of the first and second electrodes abut a surface of the cladding layer, and the bottom portions of the first and second electrodes extend inside the cladding layer; and
a waveguide configured to carry the light signal in the waveguide mode and placed relative to the first electrode such that the first electrode is located between the waveguide and the semiconductor material, wherein the semiconductor material is disposed to partially extend into the respective bottom portions of the first and second electrodes, wherein the first and second electrodes are spaced at a determined distance.

2. The apparatus of claim 1 wherein the waveguide and the photodetector are placed side-by-side.

3. The apparatus of claim 1 wherein the photodetector is stacked over the waveguide.

4. The apparatus of claim 1 wherein the second electrode is separated from the first electrode by a determined distance.

5. The apparatus of claim 4 wherein the second electrode is separated from the waveguide by the semiconductor material.

6. The apparatus of claim 4 wherein the electrodes comprise copper (Cu).

7. The apparatus of claim 1 wherein the semiconductor material comprises germanium (Ge).

8. The apparatus of claim 1 wherein the waveguide comprises silicon nitrite.

9. The apparatus of claim 1 wherein the photodetector is polarization sensitive.

10. The apparatus of claim 9 wherein the photodetector is configured to detect optical logic signals based on polarization of the light signal.

11. The apparatus of claim 1 wherein the determined distance is about 1 micrometer (um) and wherein a distance between the waveguide and the first electrode is about 0.9 um.

12. A method, comprising:
    forming a metal-semiconductor-metal (MSM) device from first and second electrodes with a semiconductor material, the forming including disposing the first and second electrodes inside a cladding layer to extend from a surface of the cladding layer inside the cladding layer, wherein the first and second electrodes include respective top and bottom portions, the forming further including disposing respective ends of the top portions of the first and second electrodes to abut a surface of the cladding layer, and the bottom portions of the first and second electrodes to extend inside the cladding layer, the forming further including spacing the first and second electrodes at a determined distance and disposing the semiconductor material to partially extend into the respective bottom portions of the first and second electrodes; and
    routing the waveguide in proximity to a metal-semiconductor-metal (MSM) device, wherein the routing includes placing the waveguide such that the first electrode is located between the waveguide and the semiconductor material.

13. The method of claim 12 wherein the second electrode is separated from the waveguide by the semiconductor material.

14. The method of claim 12 wherein the semiconductor material comprises germanium (Ge).

15. The method of claim 12 wherein the first and second electrodes comprise copper (Cu).

16. The method of claim 12 wherein the MSM device is polarization sensitive.

17. The method of claim 16 further comprising: forming the waveguide from silicon nitride.

18. The method of claim 16 further comprising: detecting optical logic signals with the MSM device based on polarization of the light signal.

19. The method of claim 12, wherein the determined distance is about 1 micrometer (um) and wherein a distance between the waveguide and the first electrode is about 0.9 um.

* * * * *